(12) United States Patent
Quinlan (10) Patent No.: US 11,128,127 B2
(45) Date of Patent: Sep. 21, 2021

(54) FLISR WITHOUT COMMUNICATION

(71) Applicant: S&C Electric Company, Chicago, IL (US)

(72) Inventor: Michael Quinlan, Chicago, IL (US)

(73) Assignee: S&C Electric Company, Chicago, IL (US)

( * ) Notice: Subject to any disclaimer, the term of this patent is extended or adjusted under 35 U.S.C. 154(b) by 268 days.

(21) Appl. No.: 16/580,404

(22) Filed: Sep. 24, 2019

(65) Prior Publication Data

US 2020/0119546 A1 Apr. 16, 2020

Related U.S. Application Data

(60) Provisional application No. 62/744,823, filed on Oct. 12, 2018.

(51) Int. Cl.
*G01R 31/08* (2020.01)
*H02H 7/26* (2006.01)
*G06Q 50/06* (2012.01)

(52) U.S. Cl.
CPC ............. *H02H 7/262* (2013.01); *G01R 31/08* (2013.01); *G06Q 50/06* (2013.01)

(58) Field of Classification Search
CPC ........... H02H 7/262; G01R 3/08; G06Q 50/06
See application file for complete search history.

(56) References Cited

U.S. PATENT DOCUMENTS

| | | | | |
|---|---|---|---|---|
| 2007/0242402 A1* | 10/2007 | Papallo | ............. | H02J 13/00028 361/63 |
| 2010/0036538 A1* | 2/2010 | Stergiou | ................... | H02H 7/30 700/292 |
| 2013/0271879 A1* | 10/2013 | Andersen | ............... | H02H 7/261 361/20 |
| 2014/0277804 A1* | 9/2014 | Witte | ....................... | H02H 3/06 700/293 |
| 2019/0280476 A1* | 9/2019 | Fan | ..................... | H02H 1/0007 |

* cited by examiner

*Primary Examiner* — Scott Bauer (57) ABSTRACT

A control system and method for a feeder, or portion of the distribution grid, which enables fault location, isolation and service restoration without communications between the feeder switches. The method uses definite time coordination between feeder switches and local measurements to determine which switches should open or close in order to isolate the fault and restore service downstream of a faulted section. Time-current characteristics and feeder topology are shared with all switches in the feeder prior to a fault event. When a disturbance occurs, a timer is started at each switch. When a switch measures voltage loss in all three phases, it stops its timer. Each switch evaluates the timer values and, when a particular switch determines based on the time-current characteristics that the immediate upstream switch opened to isolate the fault, that particular switch also opens. Power upstream of the particular switch is then provided by an alternative source.

20 Claims, 5 Drawing Sheets

FLISR WITHOUT COMMUNICATION

CROSS-REFERENCE TO RELATED APPLICATION

This application claims the benefit of priority from the U.S. Provisional Application No. 62/744,823, filed on Oct. 12, 2018, the disclosure of which is hereby expressly incorporated herein by reference for all purposes.

BACKGROUND

Field

The present disclosure relates generally to a control scheme for feeder switches on an electrical grid. More particularly, it relates to a control method and system for a feeder, or section of the distribution grid, which enables fault location, isolation and service restoration without requiring real-time communications between the feeder switches.

Discussion of the Related Art

An electrical power transmission/distribution network, often referred to as an electrical grid, typically includes a number of power generation plants each including a number of power generator units, such as gas turbine engines, nuclear reactors, coal-fired generators, hydro-electric dams, etc. The grid may also include wind and/or solar energy generation farms. Not only are there many different types of energy generators on the grid, but there are also many different types of loads, and the generators and loads are distributed over large geographic areas. The transmission grid carries electricity from the power plants over long distances at high voltages. The distribution grid, separated from the transmission grid by voltage-reducing substations, provides electricity to the consumers/loads.

Many portions of the distribution grid, commonly known as feeders, are arranged between two different sources (i.e., substations), where one source is a main or primary source which is normally connected to and powers the feeder, and the other source is an alternate source which is normally disconnected from the feeder by a switch. Additional switches are also typically placed along the length of a feeder, thereby creating multiple feeder sections each separated by a switch, where each feeder section typically serves multiple customers.

Control of the feeder switches has been largely automated in recent years, using a strategy known as fault location, isolation and service restoration (FLISR). FLISR applications can reduce the number of customers impacted by a fault by automatically isolating the trouble area and restoring service to remaining customers by transferring them to adjacent circuits. In addition, the fault isolation feature of the technology can help crews locate the trouble spots more quickly, resulting in shorter outage durations for the customers impacted by the faulted section.

Until now, applications of FLISR have relied on real-time communications to/from the switches in a feeder. That is, the switches need to communicate data to each other or to a common controller which indicates what voltages and currents are measured at each location, along with switch open/closed status, where the measurement data is used to determine a fault location and a sequence of switch openings and closings which will isolate the fault and restore service to other sections of the feeder. FLISR based on real-time communications works effectively when the communication channels are operable, but is completely defeated when the communication channels are interrupted for any reason.

In view of the circumstances described above, there is a need for a FLISR implementation approach which does not rely on real-time communications between switches and controllers in feeders on the distribution grid.

SUMMARY

The present disclosure describes a control system and method for a feeder, or portion of the distribution grid, which enables fault location, isolation and service restoration without requiring real-time communications between the feeder switches. The method uses definite time coordination between switches in the feeder and local measurements to determine which switches should open or close in order to isolate the fault and restore service downstream of a faulted section. Time-current characteristics and feeder topology are shared with all switches in the feeder at some time prior to a fault event. When a disturbance occurs, a timer is started at each switch. When a switch measures voltage loss in all three phases, it stops its timer. Each switch evaluates the timer values and, when a particular switch determines based on the time-current characteristics that the immediate upstream switch opened to isolate the fault, that particular switch also opens. Power upstream of the particular switch is then provided by an alternative source.

Additional features of the present disclosure will become apparent from the following description and appended claims, taken in conjunction with the accompanying drawings.

DETAILED DESCRIPTION OF THE EMBODIMENTS

The following discussion of the embodiments of the disclosure directed to a technique for implementing fault location, isolation and service restoration (FLISR) in a distribution grid feeder without communication is merely exemplary in nature, and is in no way intended to limit the disclosure or its applications or uses.

An electrical power grid consists of a transmission network and a distribution network. The transmission network handles the movement of electrical energy from a generating site, such as a power plant, to an electrical substation. The distribution network moves electrical energy on local wiring between substations and customers. Because the distribution portion of the grid includes power lines which are susceptible to problems such as downed power poles and downed tree limbs, faults are relatively common on the distribution grid. Fault location, isolation and service restoration (FLISR) is the name given to a set of techniques used to recover from faults on the distribution grid.

Figure 1:
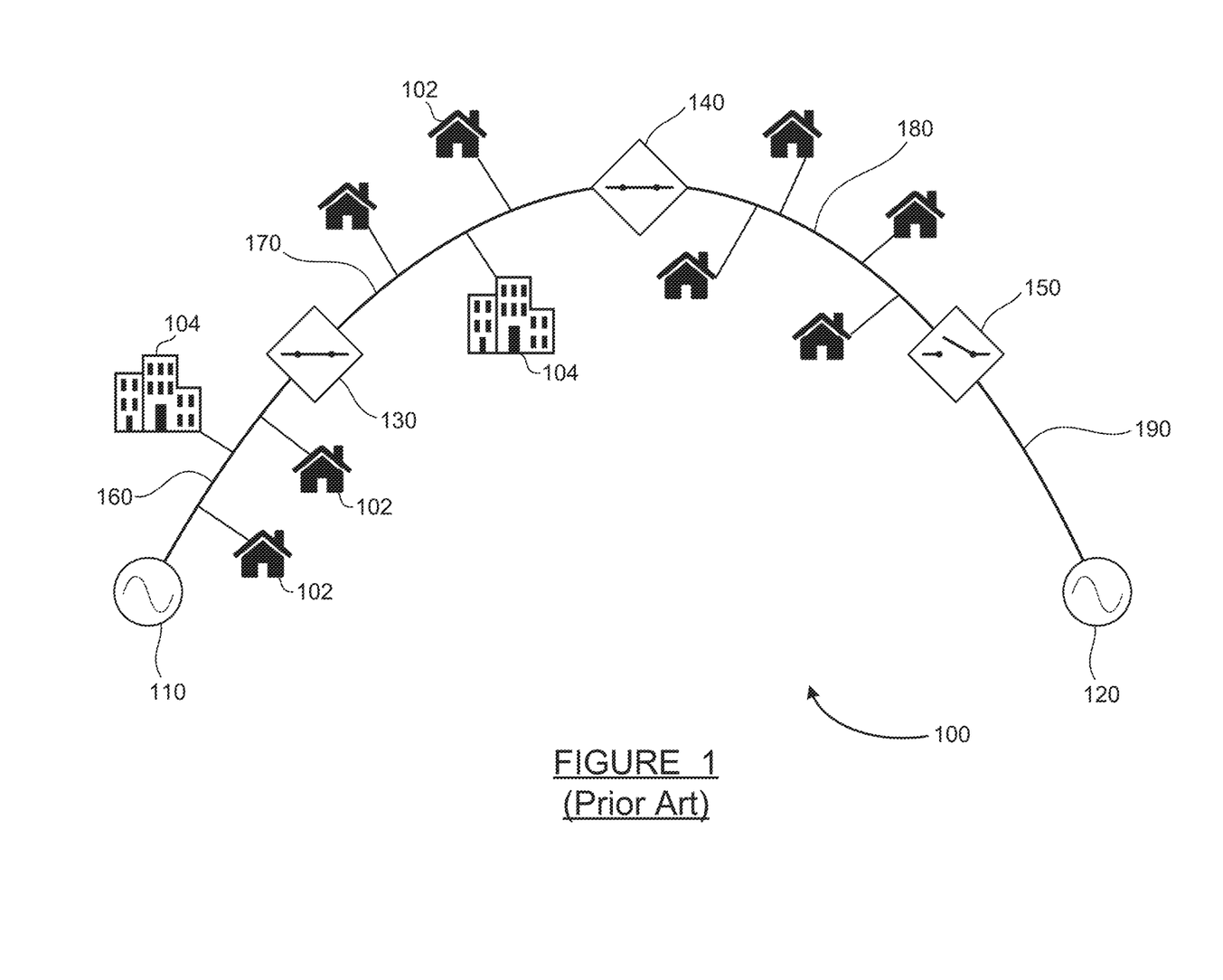
FIG. 1 is a schematic diagram of a typical feeder, or portion of the distribution grid, as known in the art.

FIG. 1 is a schematic diagram of a typical feeder 100, or portion of the distribution grid, as known in the art. The feeder 100 provides electrical energy to many end customers, including houses 102 and businesses 104. The feeder 100 has a main source 110 at one end and an alternative source 120 at the other end. The sources 110 and 120 are typically substations, where high voltage energy (often several hundred thousand volts) on the transmission grid is transformed down to relatively low voltage energy (less than 30,000 volts). The main source 110 is normally connected to and provides the power to the feeder 100, while the alternative source 120 is normally disconnected from the feeder 100 by a switch.

Between the main source 110 and the alternative source 120, switches 130, 140 and 150 divide the feeder 100 into sections. A section 160 is located between the main source 110 and the switch 130, a section 170 is located between the switch 130 and the switch 140, and a section 180 is located between the switch 140 and the switch 150. The switches 130 and 140 are normally closed, so that the main source 110 provides power to the sections 160, 170 and 180 of the feeder 100. The switch 150 is normally open, with a section 190 between the alternative source 120 and the switch 150. The section 190 may or may not include any customer connections. For the purposes of this discussion, the section 190 is powered by the alternative source 120, regardless of whether the section 190 includes customer connections.

It is to be understood that the feeder 100 is a three-phase network. That is, each of the sections 160, 170 and 180 includes three lines ($L_1, L_2, L_3$), each 120° out of phase with the others. The houses 102 and the businesses 104 may receive service from one or more of the phases, where the houses 102 almost always have single-phase service, and the businesses 104 may have three-phase service if they have high energy demands and/or large inductive loads such as motors.

If a fault occurs in the feeder 100, such as for example a lightning strike which damages or knocks down one or more power lines in the section 170, it is possible to isolate the fault and restore power to the sections 160 and 180 by opening the switches 130 and 140 and closing the switch 150. This fault isolation and service restoration could be performed by line service crews visually locating the fault and manually opening and closing switches. A much better alternative is the use of FLISR techniques, which have resulted in fault isolation and service restoration happening automatically and very fast.

However, traditional automated FLISR techniques require real-time communication between the switches 130/140/150 and a common controller, so that voltage and current measurements at each device, along with device open/closed status, can be used to command and control the status of other adjacent devices. These real-time communication-based FLISR techniques work well as long as the communication channels are operable, but are completely defeated if the communication channels are inoperable. Even with current technology, any communication medium can experience an outage—whether due to equipment failure, infrastructure damage, wireless signal interference or jamming, computer malware, or otherwise. For these reasons, a new FLISR technique which does not rely on real-time communication is needed.

The present disclosure provides a technique for implementing FLISR without real-time communication between switch devices. This scheme enables service restoration downstream of a faulted section quickly, regardless of communication speed, availability, or operability. Preventing lengthy loss of voltage in these sections can avoid unwanted disconnection of important devices and can reduce momentary outages on the system.

In the disclosed method, all switch devices are initially coordinated with definite time protection curves. The protection settings of each device as well as the topology of the devices are shared at some time prior to a fault event, such as when the feeder is initially installed or re-configured with additional switches. When a fault event occurs and a switch device measures a voltage disturbance in the system, it begins a timer. Once a device measures voltage loss in all three phases, it stops the timer. If the device is open, it will begin closing. If the device is closed, it will compare the time recorded between the disturbance and loss of voltage. If the time is determined to match the amount of time the closest upstream device's protection curve would have caused it to open, within some tolerance limit, the device will open. Thus, fault isolation and service restoration are accomplished solely based on measurements and calculations local to each switch device, with no need for communication between devices.

The following discussion of FIGS. 2-5 provides a detailed explanation and examples of the techniques for FLISR without communication described briefly above. Throughout this discussion, it should be understood that each of the switch devices includes voltage and current measurement sensors, a controller or processor which receives the measurements from the sensors and performs the calculations and logic of the disclosed methods, and an actuator capable of opening or closing the switch (for all three phases) upon command from the controller.

One premise of the disclosed method is that the topology of the feeder (how many switches are present in the feeder, and the order in which they are connected) is known to all switch devices in the feeder. Furthermore, each of the switches has a pre-defined time protection characteristic, also known to all other switches in the feeder, which designates how quickly the switch will open upon experiencing excessive current.

Figure 2:
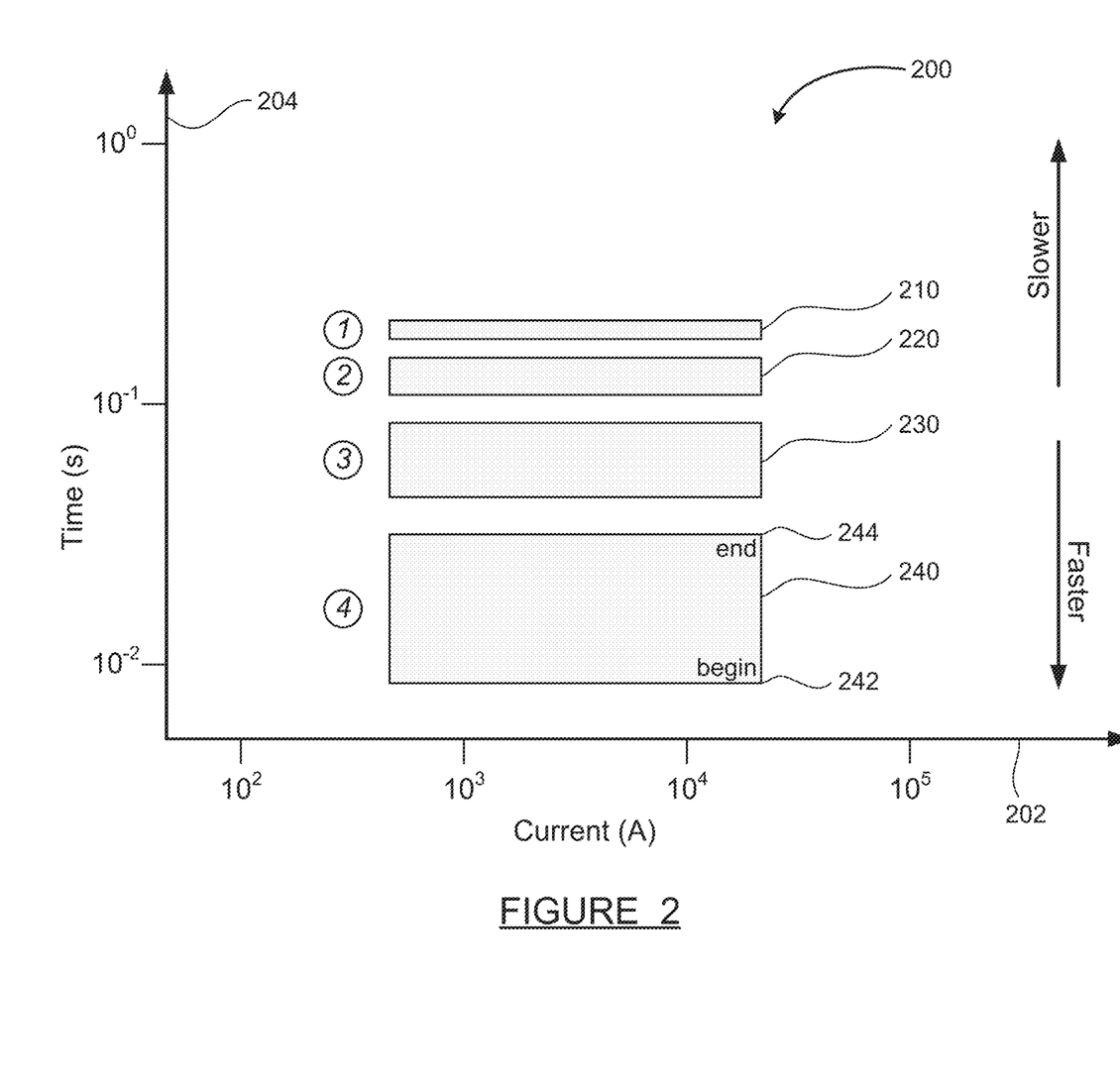
FIG. 2 is a time-current characteristic plot for closed switches, according to an embodiment of the present disclosure.
Figure 3:
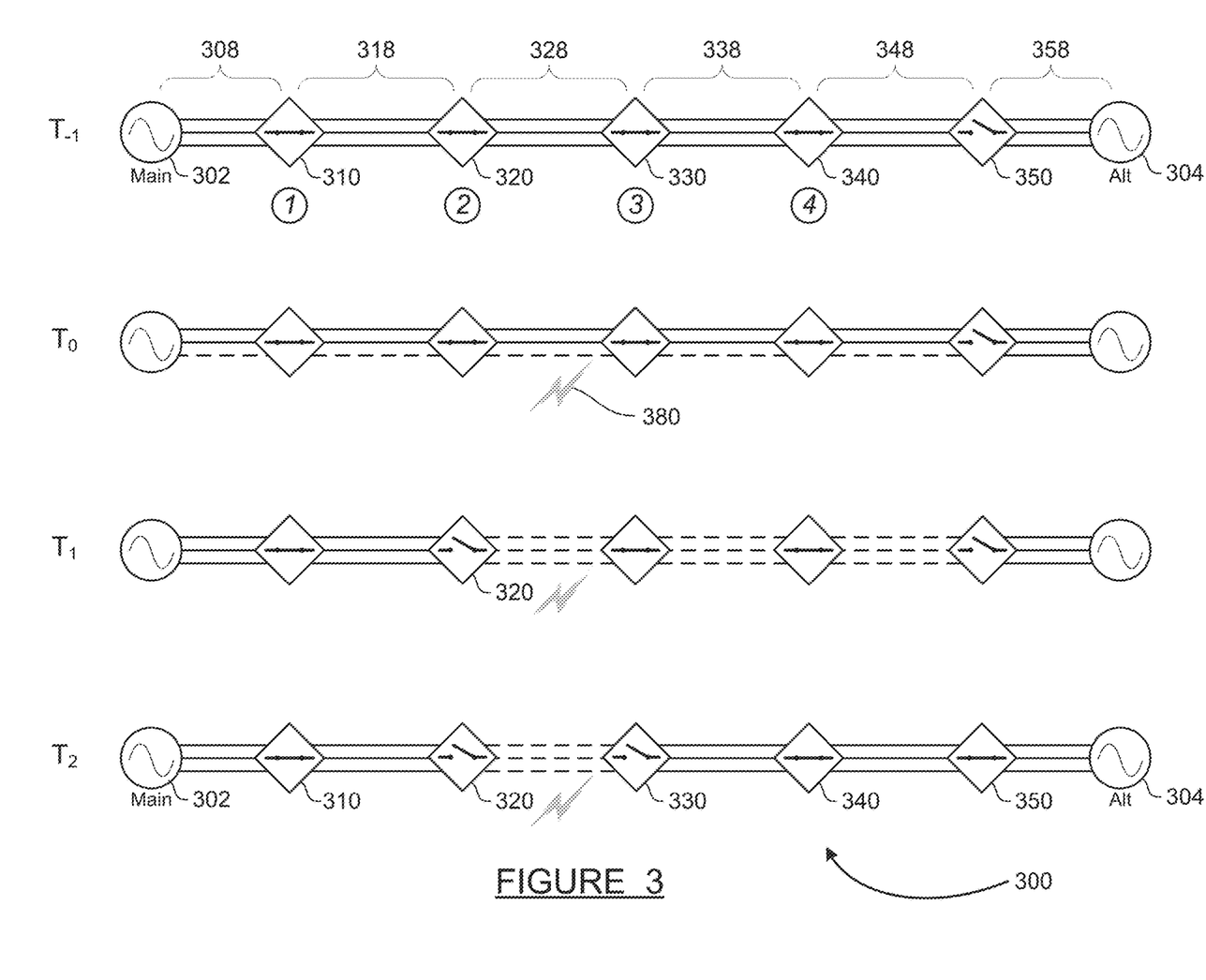
FIG. 3 is a schematic diagram of a feeder at four sequential points in time, illustrating switch behavior logic for FLISR without communication, according to an embodiment of the present disclosure.

FIG. 2 is a time-current characteristic plot 200 for normally-closed switches in a feeder, according to an embodiment of the present disclosure. Consider that a feeder includes four normally-closed switches (numbered 1-4 in the circles at left). Such a feeder is illustrated in FIG. 3 and discussed in detail below. Time-current characteristics are defined for each of the switches such that the switch which is furthest from the main source (switch 4) is fastest acting, and the switch which is closest to the main source (switch 1) is slowest acting.

On the time-current characteristic plot 200, a horizontal axis 202 represents current in amps (log scale), and a vertical axis 204 represents time in seconds (also on a log scale). A box 210 defines the time-current window within which switch 1 will trip open (remember that all of the switches are normally closed). Similarly, a box 220 defines the time-current window within which switch 2 will trip open, a box 230 defines the time-current window within which switch 3 will trip open, and a box 240 defines the time-current window within which switch 4 will trip open. The time-current characteristic boxes 210-240 must be non-overlapping and have some separation time in between, as shown in FIG. 2.

The time-current characteristic box 240 (for switch 4) will now be discussed in more detail. The lower edge of the box 240 represents a begin time 242, which in this example is a little less than $10^{-2}$ seconds (i.e., a little less than 0.01 seconds). The begin time 242 is the time at which switch 4 will begin to open if the switch experiences a current in the range of the box 240 (from about 600 amps up to about 20,000 amps, such as would be experienced during a line-to-line or line-to-ground fault). The upper edge of the box 240 represents an end time 244, which is the time at which switch 4 will be fully open, and which in this example is about 0.04 seconds. As mentioned above, switch 4, which is furthest from the main feeder source, must have the fastest time-current characteristic.

The time-current characteristic boxes 230 (for switch 3), 220 (for switch 2), and 210 (for switch 1) are similarly defined, with each being successively slower so as to define a cadence or sequence of programmed switch openings.

FIG. 3 is a schematic diagram of a feeder 300 at four sequential points in time, illustrating switch behavior logic for FLISR without communication, according to an embodiment of the present disclosure. At the top of FIG. 3, a time $T^{-1}$ represents normal operation of the feeder 300. The feeder 300 is configured very much like the feeder 100 of FIG. 1. The feeder 300 has a main source 302 (typically a substation) at one end, and an alternative source 304 at the other end. Normally-closed switches 310, 320, 330 and 340 divide the feeder 300 into sections 308, 318, 328, 338 and 348. A normally-open switch 350 isolates the alternative source 304 from the feeder 300 during normal operation, and creates a section 358.

The switches 310, 320, 330 and 340 represent the switches 1-4 of FIG. 2, as indicated by the circled numbers 1-4 which appear below each switch at time $T^{-1}$ on FIG. 3. The switch 310 (switch 1) is closest to the main source 302 and therefore has the slowest time-current characteristic as indicated on FIG. 2. The switches 320 (switch 2) and 330 (switch 3) each have successively faster time-current characteristics. The switch 340 (switch 4) is furthest from the main source 302 and therefore has the fastest time-current characteristic as indicated on FIG. 2. As discussed earlier, the feeder topology and the time-current characteristics of each of the switches 310-340 is made known to all of the switches during or prior to the $T^{-1}$ normal operation of the feeder 300. This information is provided to the processor or controller which is part of each switch, and may be provided by any communication technology (high speed, low speed, hard-wired, wireless) or by manual download from a portable programming device carried by a line service technician.

At a time $T^0$, a fault 380 occurs in the section 328 between the switch 320 and the switch 330. At the instant the fault 380 occurs)($T^0$, the switches 310-350 all have the same open or closed status as at the time $T^{-1}$, as can be seen at $T^0$ in FIG. 3. When the fault 380 occurs at $T^0$, each of the switches 310-350 will detect a disturbance of some sort on the feeder 300. The switches 310 and 320 may detect an increase in current on one or more phase, and the switches 330-350 may detect a decrease in voltage on one or more phase. In FIG. 3, the disturbance is shown as being present on one of the lines/phases at $T^0$, as indicated by the dashed line. Based on the detection of the voltage disturbance, at least the switches 330 and 340 start a timer when the fault 380 occurs at $T^0$.

At a time $T^1$, the switch 320 opens due to its time-current characteristics (protection curve). Bear in mind that the switch 340 (switch 4) has the fastest time-current protection curve, but does not experience a high current because it is downstream of the fault. Thus, the switch 340 does not trip open. Similarly, the switch 330 (switch 3) has the next fastest time-current protection curve, but also does not experience a high current because it is downstream of the fault, and therefore does not open. The switch 320 (switch 2) has the next fastest time-current protection curve, and it does experience a high current because it is upstream of the fault, and therefore the switch 320 does open at the time $T^1$. With the switch 320 open at $T^1$, normal service is restored (solid lines) to the sections 308 and 318, and power is completely cut off (dashed lines) on all three lines/phases to the sections 328, 338 and 348.

When the switches 330 and 340 detect a complete loss of voltage on all three phases at the time $T^1$, they stop their timer. The timer value at each of the switches 330 and 340 will be equal to the elapsed time between when the disturbance was first noticed ($T^0$) and when a complete loss of voltage on all three phases was detected ($T^1$). This elapsed time is in turn equal to the time taken by the switch 320 (switch 2) to open, which is just a little over 0.1 seconds according to its time-current characteristics as shown on FIG. 2.

After stopping their timer, the switches 330 and 340 will examine the timer value to determine if the switch immediately upstream opened due to its time-current characteristics. The switch 340 will determine that the timer value (a little over 0.1 seconds) does not match the time-current characteristics of its immediate upstream neighbor (the switch 330), and therefore the switch 340 will not open according to the logic of the disclosed method. The switch 330, however, will determine that the timer value (a little over 0.1 seconds) does match the time-current characteristics of its immediate upstream neighbor (the switch 320). Therefore, the switch 330 will open according to the logic of the disclosed method, because it knows that the switch 320 opened in order to isolate the fault.

At a time $T^2$, the switch 320 remains open, switch 330 has opened due to the logic described above, and the switch 350 has closed due to the detection of complete voltage loss and after allowing sufficient time for the fault to be isolated via the opening of the switch 330. Thus, at the time $T^2$, the fault 380 has been isolated between the opened switches 320 and 330, and the section 328 is completely without power and therefore safe for line crews to work on. The sections 308 and 318 have service restored on all three phases with their power provided by the main source 302, and the sections 338 and 348 have service restored on all three phases with their power provided by the alternative source 304.

To summarize what happened in FIG. 3; upon occurrence of the fault 380, the time-current characteristics caused the switch 320 to open due to excessive current, the timer value associated with a complete three-phase voltage loss caused the switch 330 to open because it determined that its upstream neighbor had opened due to its protection curve, and the switch 350 closed to restore service downstream of the fault 380. All of this fault location, isolation and service restoration happened without communication between the switches, using only predefined information, local measurements, a timer and predefined logic.

Figure 4:
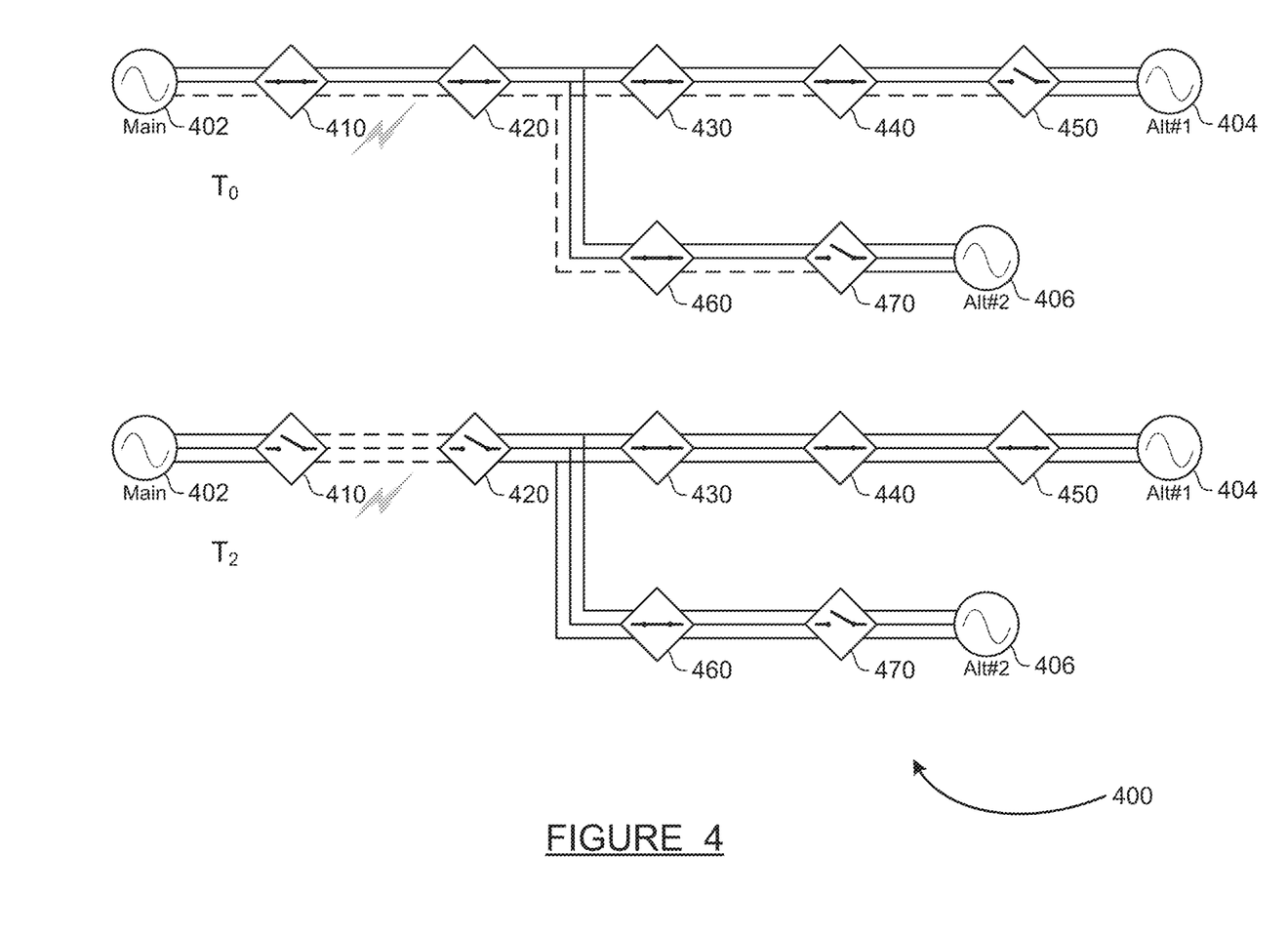
FIG. 4 is a schematic diagram of a branched or multiple tie feeder at two points in time, illustrating switch behavior logic for FLISR without communication, according to an embodiment of the present disclosure.

FIG. 4 is a schematic diagram of a branched or multiple tie feeder 400 at two points in time, illustrating switch behavior logic for FLISR without communication, according to an embodiment of the present disclosure. The feeder 400 includes a branch, with a different alternative source located at the end of each branch, and is used to illustrate additional logic which may be used with the disclosed methods in order to avoid the creation of a temporary closed loop connecting two sources.

The feeder 400 includes a main source 402, and normally-closed switches 410, 420, 430 and 440 along a main branch to a first alternative source 404 separated by a normally-open switch 450. Between the switches 420 and 430, the feeder 400 branches off to a secondary branch including a normally-closed switch 460 leading to a second alternative source 406 separated by a normally-open switch 470.

At a time $T^0$, a fault occurs on one line/phase between the switch 410 and the switch 420. This results in a disturbance one the one phase felt throughout the entire feeder 400. Namely, the switch 410 detects an increased current on the faulted phase, and the remaining switches all detect a voltage drop on the faulted phase. When the fault occurs at the time $T^0$, all of the switches start their timer, as discussed previously in relation to FIG. 3.

At a time $T^1$ (not shown), the switch 410 opens due to its time-current characteristics. Only the switch 410 experiences an increased current due to the fault; therefore, only the switch 410 can open due to its time-current characteristics. When the switch 410 opens, all of the remaining switches experience a complete loss of voltage on all three phases, and stop their timers.

At a time $T^2$, the switch 420 determines that its upstream neighbor opened due to its time-current characteristics, based on the timer value measured by the switch 420. Thus, the switch 420 will open in response to the opening of the switch 410. This isolates the fault between the switches 410 and 420, both of which are now open. All that remains is to close a switch to an alternative source in order to restore service to sections downstream of the fault. However, there are two alternative sources (404 and 406) on the feeder 400, and if both the switch 450 and the switch 470 are closed, the sources 404 and 406 will be connected to each other, which may be undesirable.

In order to prevent the closed-loop connection of the sources 404 and 406, pre-defined logic may be established and used to determine which one of the switches 450 or 470 should be closed. In the case shown in FIG. 4, either the switch 450 or the switch 470 may be closed to restore service to all sections downstream of the switch 420. Thus, one switch—either the switch 450 or the switch 470—should be designated as having precedence over the other. Precedence may be established based on any appropriate factor—such as capacity of the connection to the transmission grid, age of equipment, etc. In FIG. 4, the switch 450 is closed at the time $T^2$, thus restoring service on all three phases to all portions of the feeder 400 which are downstream of the switch 420. At this point, the fault is isolated between the switches 410 and 420 and this section is without power, a small portion of the feeder is powered by the main source 402, and the remainder of the feeder 400 is powered by the first alternative source 404.

Several other scenarios are possible with the branched feeder 400. Consider a case where, after the time $T^2$ of FIG. 4, another fault occurs between the switch 430 and the switch 440. After the time $T^2$, the feeder 400 has a different topology than before the time $T^0$. Therefore, the switch sequence and time-current characteristics must be redefined based on power being provided by the alternative source 404. When the secondary fault occurs between the switch 430 and the switch 440, the switches 430-470 can use the logic of the disclosed methods to isolate the fault and restore service to unaffected sections, using the redefined topology and time-current characteristics. In this case, the switches 430 and 440 would be opened to isolate the fault, the sections to the right of the switch 440 would be powered by the alternative source 404, and the entire lower branch of the feeder 400 would be powered by the alternative source 406 when the switch 470 closes.

Another scenario to consider is where a single fault occurs in the area of the feeder 400 near the branch point, between the switches 420, 430 and 460. In this case, the switch 420 would open due to its time-current characteristics, and both the switches 430 and 460 would open based on their timers indicating that the upstream neighbor (the switch 420) opened. Then, both of the switches 450 and 470 would close in order to restore power to their respective branch of the feeder 400.

It is readily apparent how any other fault location scenario would be handled in the feeder 400 using the disclosed methods. For example, if a fault occurs between the switches 430 and 440, those two switches would open using the disclosed logic, the switch 450 would close to provide power to the right of the switch 440, and the switch 470 would stay open, with the remainder of the feeder 400 receiving power from the main source 402.

Again, all of this FLISR behavior is accomplished based on pre-defined network topology and time-current characteristics, local current and voltage measurements and timing, and pre-programmed logic at each switch. No real-time communication between switches and a common controller is required.

Figure 5:
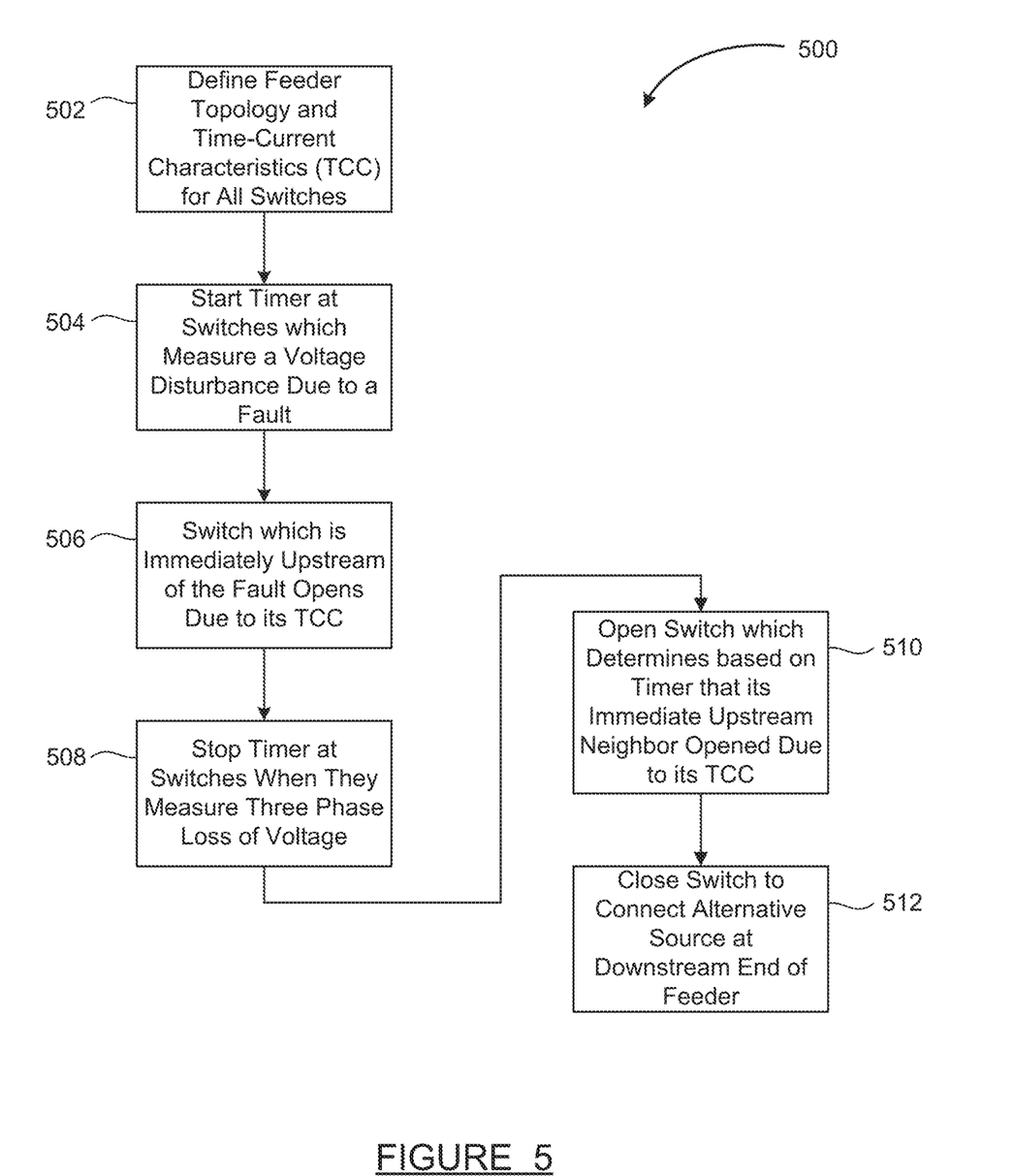
FIG. 5 is a flowchart diagram of a method for controlling feeder switches to isolate a fault and restore service downstream of the fault, according to an embodiment of the present disclosure.

FIG. 5 is a flowchart diagram 500 of a method for controlling feeder switches to isolate a fault and restore service downstream of the fault, according to embodiments of the present disclosure discussed above in relation to FIGS. 2, 3 and 4. At box 502, a feeder topology is defined, and time-current characteristics (protection curves) are defined for all switches in the feeder based on the topology. This information is provided to all of the switches in the feeder using any type of communication channel or manual uploading. The topology defines the ordered connectivity of the switches to each other and to main and alternative power sources. The time-current characteristics (protection curves) define the time at which each normally-closed switch will begin and end opening when experiencing a current above a certain value or within a certain range.

At box 504, when a fault occurs on the feeder, a timer is started by all switches which measure a voltage disturbance. This will include the switches which are downstream of the fault location. At box 506, the switch immediately upstream of the fault location trips open due to its time-current characteristics (protection curve). This is because only switches upstream of the fault location experience excessive current associated with the fault, and the switch immediately upstream of the fault will have the fastest time-current characteristics based on the topology of the feeder.

At box 508, all switches downstream of the just-opened switch will experience a complete loss of voltage on all three phases. When they measure this voltage loss, the switches which had previously started a timer will stop the timer. The resulting timer value designates an elapsed time between the fault and the opening of the switch upstream of the fault. Using this timer value, it is possible to determine exactly which switch in the topology opened. At box 510, one of the downstream switches determines that its immediate upstream neighbor opened due to its protection curve, and this switch then itself opens. At that point, the fault has been isolated between the two opened switches. At box 512, a normally-opened switch at the downstream end of the feeder closes, which connects the alternative source to the sections of the feeder downstream of the opened switches.

The process described in the flowchart diagram 500 isolates the fault and restores service downstream using only local information and measurements, without need for communication between the switches.

Another method step may be added after the box 512—redefining the topology and the time-current characteristics of the switches after recovering from a fault (to prepare for a possible subsequent fault, which could also be recovered from without communication). This redefinition of the topology and the time-current characteristics of the switches could be done by a low-speed communication from some central controller, or it could be done in a communication-free manner by pre-defining the topology and switch protection curves for any possible post-fault scenario. For example, "if switches A and B open to isolate a first fault, then the new topology and switch protection curves are defined as . . . ".

Another method step may be added before the box 512 for branched feeders as shown in FIG. 4. In this case, before closing the switch at the downstream end, it must be determined which of the more than one alternative sources takes precedence and should be connected.

As will be well understood by those skilled in the art, the several and various steps and processes discussed herein to describe the disclosed methods may be referring to operations performed by a computer, a processor or other electronic calculating device that manipulate and/or transform data using electrical phenomenon. In particular, this refers to the control calculations and operations performed by controllers or processors included in each of the switches in the feeders of FIGS. 3 and 4. Those processors and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The disclosed methods for fault location, isolation and service restoration without communication provide a means for implementing FLISR which is not susceptible to disruptions in communication which may accompany distribution grid faults. Using these methods, FLISR implementations become more reliable, which provides significant benefit to electrical power distribution companies, and to all consumers on the grid.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for providing fault location, isolation and service restoration in a distribution grid feeder, said method comprising:
providing, to a processor on each switch in the feeder, a feeder topology and time-current protection characteristics for each of the switches;
starting a timer by each switch in the feeder when a fault is detected in the feeder;
opening a first switch based on its time-current protection characteristics, where the first switch is located immediately upstream of the fault, where upstream indicates nearer to a main power source;
stopping the timer by each switch in the feeder which measures a total voltage loss on all three phases when the first switch is opened;
opening a second switch based on its timer value, where the second switch determines that the first switch is immediately upstream thereof based on a match between the timer value and the time-current protection characteristics of the first switch, and where opening the second switch isolates the fault between the first and second switches; and
closing a third switch to connect an alternative power source at a downstream end of the feeder.

2. The method according to claim 1 wherein the feeder topology includes definition of an order of connectivity of all of the switches between the main power source and the alternative power source.

3. The method according to claim 2 wherein the time-current protection characteristics include, for each of the switches, a definition of a range of currents which will cause each said switch to open, and a begin time and an end time for said switch to open when experiencing a current in the range.

4. The method according to claim 3 wherein each switch in the feeder has a different time-current protection characteristic based on each said switch's position in the order of connectivity, where a switch nearest the main power source in the order of connectivity is slowest-opening.

5. The method according to claim 4 wherein the time-current protection characteristics include no overlap in opening times, and a time gap exists between the end time of each switch and the begin time of a next slower switch.

6. The method according to claim 1 wherein the main power source and the alternative power source are substations connected to a power transmission grid.

7. The method according to claim 1 wherein each switch in the feeder includes current and voltage sensors, a processor with memory in communication with the sensors, and an actuator configured to open or close the switch upon receiving a command from the processor.

8. The method according to claim 1 wherein closing the third switch is performed automatically by a normally-open switch proximal the alternative power source at a predetermined lag time after detection of a total voltage loss on all three phases, where the lag time allows time for the second switch to open before the third switch closes.

9. The method according to claim 1 further comprising determining, when a branch point exists in the feeder, whether to connect the alternative power source at a downstream end of one branch of the feeder or a secondary alternative power source at a downstream end of another branch of the feeder.

10. The method according to claim 1 wherein the feeder topology and the time-current protection characteristics for each of the switches is provided to the processor on each of the switches at a time prior to occurrence of the fault, and is provided via any hard-wired or wireless communication channel or via manually copying to each of the switches.

11. A method for providing fault location, isolation and service restoration in a distribution grid feeder, said method comprising:
providing, to each switch in the feeder, a feeder topology and time-current protection characteristics for each of the switches;

opening a first switch immediately upstream of a fault based on the time-current protection characteristics of the first switch;

opening a second switch immediately downstream of the fault based on an elapsed time between occurrence of the fault and opening of the first switch;

and closing a normally-open switch at a downstream end of the feeder to connect an alternative power source to the feeder.

12. The method according to claim 11 wherein each switch in the feeder includes current and voltage sensors, a processor with memory in communication with the sensors, and an actuator configured to open or close the switch upon receiving a command from the processor.

13. The method according to claim 11 wherein the feeder topology and the time-current protection characteristics for each of the switches is provided to a processor on each of the switches at a time prior to occurrence of the fault, and is provided via any hard-wired or wireless communication channel or via manually copying to each of the switches.

14. A distribution grid feeder providing fault location, isolation and service restoration without communication, said feeder comprising:

a main power source at an upstream end of the feeder;

an alternative power source at a downstream end of the feeder, with a normally-open switch proximal the alternative power source and isolating the alternative power source from the feeder; and a plurality of normally-closed switches, one switch at each of a plurality of locations along the feeder between the main power source and the normally-open switch, wherein the normally-open switch and the normally-closed switches each include current and voltage sensors, a processor with memory receiving signals from the sensors, and an actuator configured to open or close the switch upon a command from the processor, and where the processor on each switch is pre-configured with a feeder topology and time-current protection characteristics for all of the switches in the feeder, and the processor is further configured with an algorithm to open a first switch immediately upstream of a fault based on the time-current protection characteristics of the first switch, open a second switch immediately downstream of the fault based on an elapsed time between occurrence of the fault and opening of the first switch, and closing the normally-open switch.

15. The feeder according to claim 14 wherein the algorithm on the processor on each switch includes:

starting a timer by each switch in the feeder when the fault is detected in the feeder;

opening the first switch based on its time-current protection characteristics;

stopping the timer by each switch in the feeder which measures a total voltage loss on all three phases when the first switch is opened;

opening the second switch based on its timer value, where the timer value is used by the second switch to determine that the first switch is immediately upstream thereof based on the time-current protection characteristics, and where opening the second switch isolates the fault between the first and second switches; and closing the normally-open switch to connect the alternative power source to the feeder at a predetermined lag time after detection of a total voltage loss on all three phases, where the lag time allows time for the second switch to open before the normally-open switch closes.

16. The feeder according to claim 14 wherein the feeder topology includes definition of an order of connectivity of all of the switches between the main power source and the alternative power source.

17. The feeder according to claim 16 wherein the time-current protection characteristics include, for each of the switches, a definition of a range of currents which will cause each said switch to open, and a begin time and an end time for said switch to open when experiencing a current in the range.

18. The feeder according to claim 17 wherein each switch in the feeder has a different time-current protection characteristic based on each said switch's position in the order of connectivity, where a switch nearest the main power source in the order of connectivity is slowest-opening, and where the time-current protection characteristics include no overlap in opening times, and a time gap exists between the end time of each switch and the begin time of a next slower switch.

19. The feeder according to claim 14 wherein the main power source and the alternative power source are substations connected to a power transmission grid.

20. The feeder according to claim 14 wherein the feeder topology and the time-current protection characteristics for each of the switches is provided to the processor on each of the switches at a time prior to occurrence of the fault, and is provided via any hard-wired or wireless communication channel or via manually copying to each of the switches.

* * * * *